United States Patent
Sands et al.

(10) Patent No.: US 6,246,576 B1
(45) Date of Patent: Jun. 12, 2001

(54) COMPUTER MOTHER BOARD MULTI-POSITION CHASSIS DRAWER LATCH AND RELEASE MECHANISM

(75) Inventors: Steven L. Sands, Austin; Andrew L. McAnally, Georgetown; Eric B. Holloway, Double Oak, all of TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/124,650

(22) Filed: Jul. 29, 1998

(51) Int. Cl.⁷ ........................................................ G06F 1/16
(52) U.S. Cl. ........................... 361/686; 361/683; 361/684; 361/685; 361/686; 361/726
(58) Field of Search .................................... 361/683–686, 361/726

(56) References Cited

U.S. PATENT DOCUMENTS

| | | | |
|---|---|---|---|
| 3,953,094 | 4/1976 | Brown, Jr. ........................... | 312/303 |
| 5,262,923 | * 11/1993 | Batta et al. ........................... | 361/685 |
| 5,379,184 | 1/1995 | Barraza et al. ........................ | 361/685 |
| 5,575,529 | 11/1996 | Dowdy et al. ..................... | 312/223.2 |
| 5,601,349 | 2/1997 | Holt ................................. | 312/265.6 |
| 5,701,231 | 12/1997 | Do et al. ............................. | 361/683 |
| 5,825,616 | 10/1998 | Howell et al. ....................... | 361/684 |

* cited by examiner

Primary Examiner—Leo P. Picard
Assistant Examiner—Yean-Hsi Chang
(74) Attorney, Agent, or Firm—Skjerven Morrill MacPherson LLP; Stephen A. Terrile; Margaret M. Kelton

(57) ABSTRACT

A lock and release mechanism is disclosed which includes an elongated bendable member which engages a lock tab such that when the lock tab is disengaged with the chassis an electronics module can be moved into a plurality of positions, including a service position, a closed position and a removal position. Such a mechanism advantageously provides latch and release functionality using a single part.

24 Claims, 8 Drawing Sheets

COMPUTER MOTHER BOARD MULTI-POSITION CHASSIS DRAWER LATCH AND RELEASE MECHANISM

FIELD OF THE INVENTION

This invention relates in general to computer systems and, more particularly, to drawer latch and release apparatus for computer systems.

DESCRIPTION OF THE RELATED ART

Computer systems in general and IBM compatible computer systems in particular have attained widespread use. These computer systems now provide computing power to many segments of today's modern society. A computer system can usually be defined as a desktop, floor-standing, or portable microcomputer that includes a system unit having a system processor with associated volatile and non-volatile memory, a display monitor, a keyboard, a hard disk storage device or other type of storage media such as a floppy disk drive or a compact disk read only memory (CD ROM) drive. One of the distinguishing characteristics of these systems is the use of a system board or motherboard to electrically connect these components together. A computer server system is an information handling system designed primarily to give computing power to groups of users and is generally purchased by small and large businesses.

Several problems arise with the existing servers that have removable systems. One problem is that space in the individual computer chassis is at a premium. Therefore, there is a need to maximize the density of the components in the system. In server systems, maximizing the density causes layering of components. Layering causes accessibility problems during assembly and during servicing of the system. One way to address the accessibility problem is to put system electronics on a metal module that can be slid in and out of the computer chassis like a drawer. However, using a drawer chassis presents additional problems. One problem is that the module may accidentally fall out of the back of the chassis during service. To prevent falling of the module, sliding rails could be used, but such a system would require several assembly operations, multiple parts and an additional cost. What is desired is a latching device that provides more than one locking position, including a position for servicing, that conserves space in the chassis and does not require multiple parts for assembly.

SUMMARY OF THE INVENTION

In accordance with the present invention, a one-piece apparatus for latching and releasing an electronics module as a drawer in a computer chassis advantageously provides a spring action and a plurality of positions for locking the mother board chassis drawer into place while having only one discrete part.

More specifically, an embodiment relates to a latching and release apparatus for use with a system having an electronics module as a drawer in a computer chassis. The latching and release includes a one-piece member that attaches to both the electronics module and to the chassis. The latch and release apparatus includes a locking tab and an actuator as part of a one-piece design. The action of the latch and release apparatus is generally to act as a spring when the thumb actuator is pressed. The lock tab mates with openings in the chassis when the actuator is released, thereby locking the electronics module in one of a plurality of positions including a closed position, a service position and a removal position.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION OF THE PREFERRED EMBODIMENTS

The following sets forth a detailed description of the best contemplated mode for carrying out the invention. The description is intended to be illustrative of the invention and should not be taken to be limiting.

Figure 1:
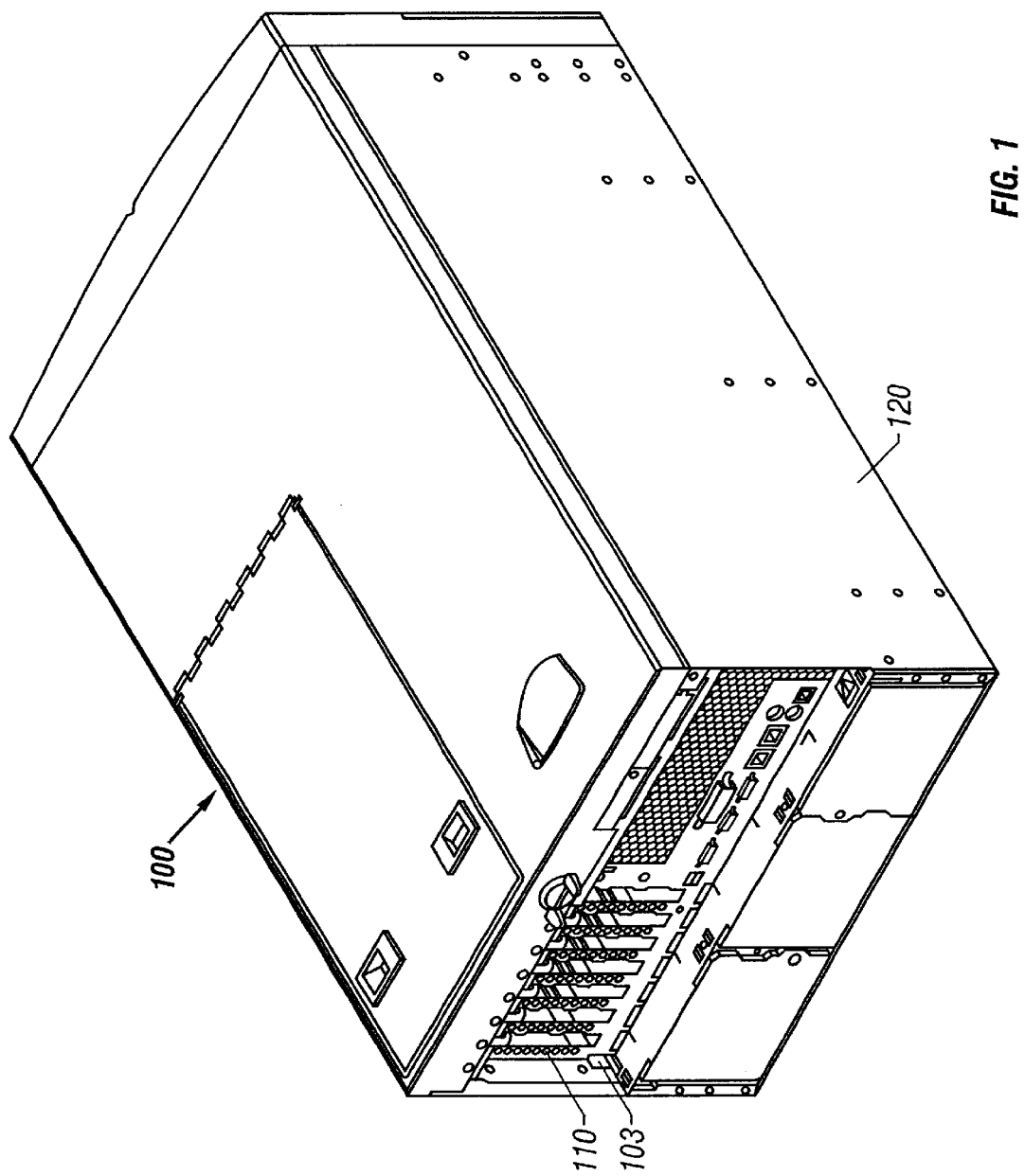
FIG. 1 is a perspective view of a computer system incorporating a lock and release apparatus including a latch actuator in accordance with an embodiment of the present invention.

FIG. 1 is a frontal pictorial view of a computer system 100 suitable for incorporating a lock and release apparatus. The illustrative computer system 100 is a server which includes an electronics module 110 in a computer chassis 120. One example of a server is the POWEREDGE 6300 offered by Dell Computer Corporation. The electronics module typically holds a mother board and other electronic devices. FIG. 1 shows actuator slot 103 in the electronics module 110 through which a latch apparatus may be inserted.

Figure 2:
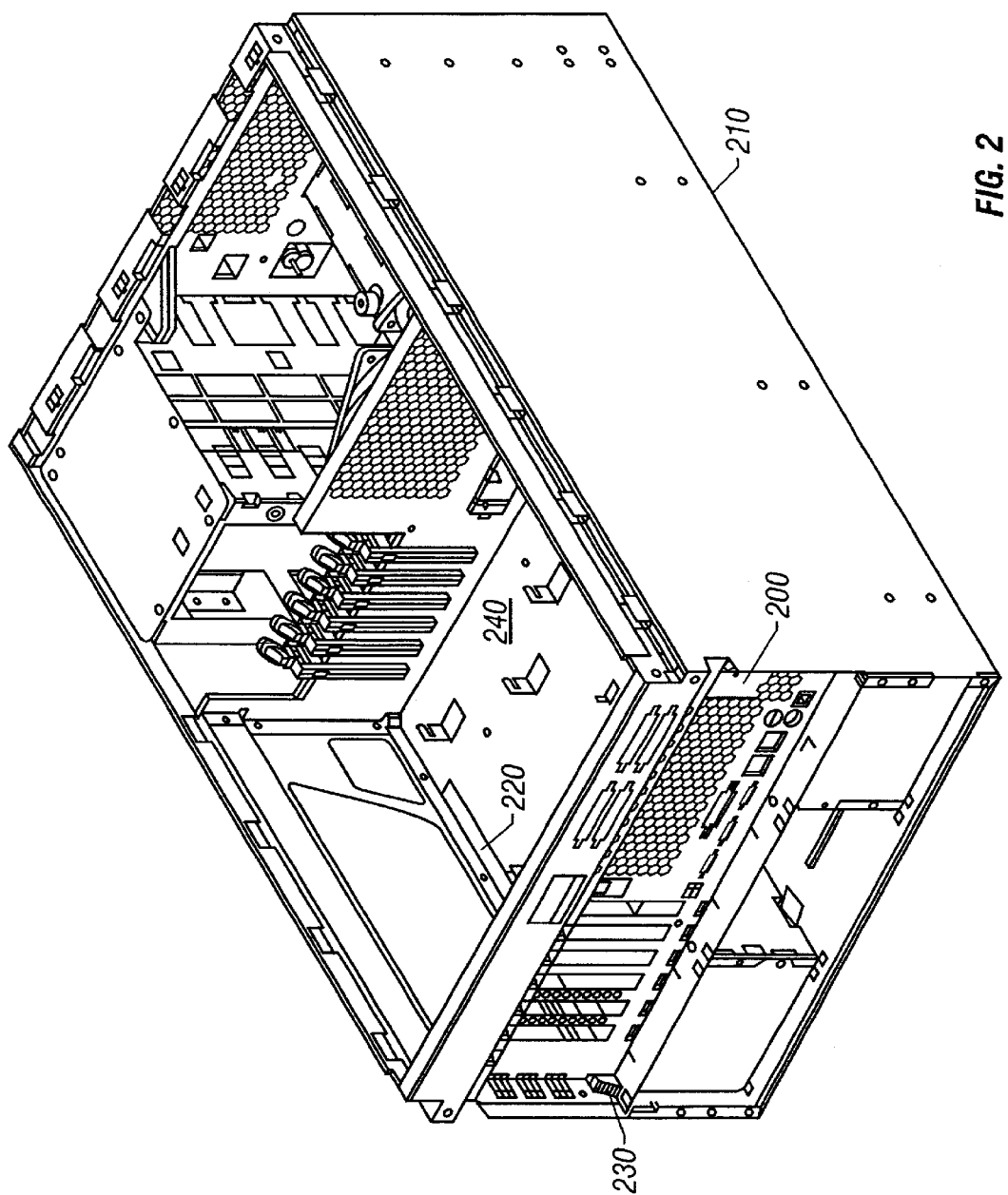
FIG. 2 is an electronics module drawer inside a computer chassis in closed position showing the latch actuator illustrated in FIG. 1.

FIG. 2 shows an electronics module 200 inside a computer chassis 210, which employs a latch apparatus 220. The electronics module 200 is shown in closed position inside the chassis 210. The latch 220 is shown such that the latch actuator 230 protrudes outside the electronics module 200. Latch 220 is positioned on the bottom of the planar base plate 240 of the electronics module 200. However, the latch 220 may operate in other positions inside an electronics module in other examples.

Figure 3:
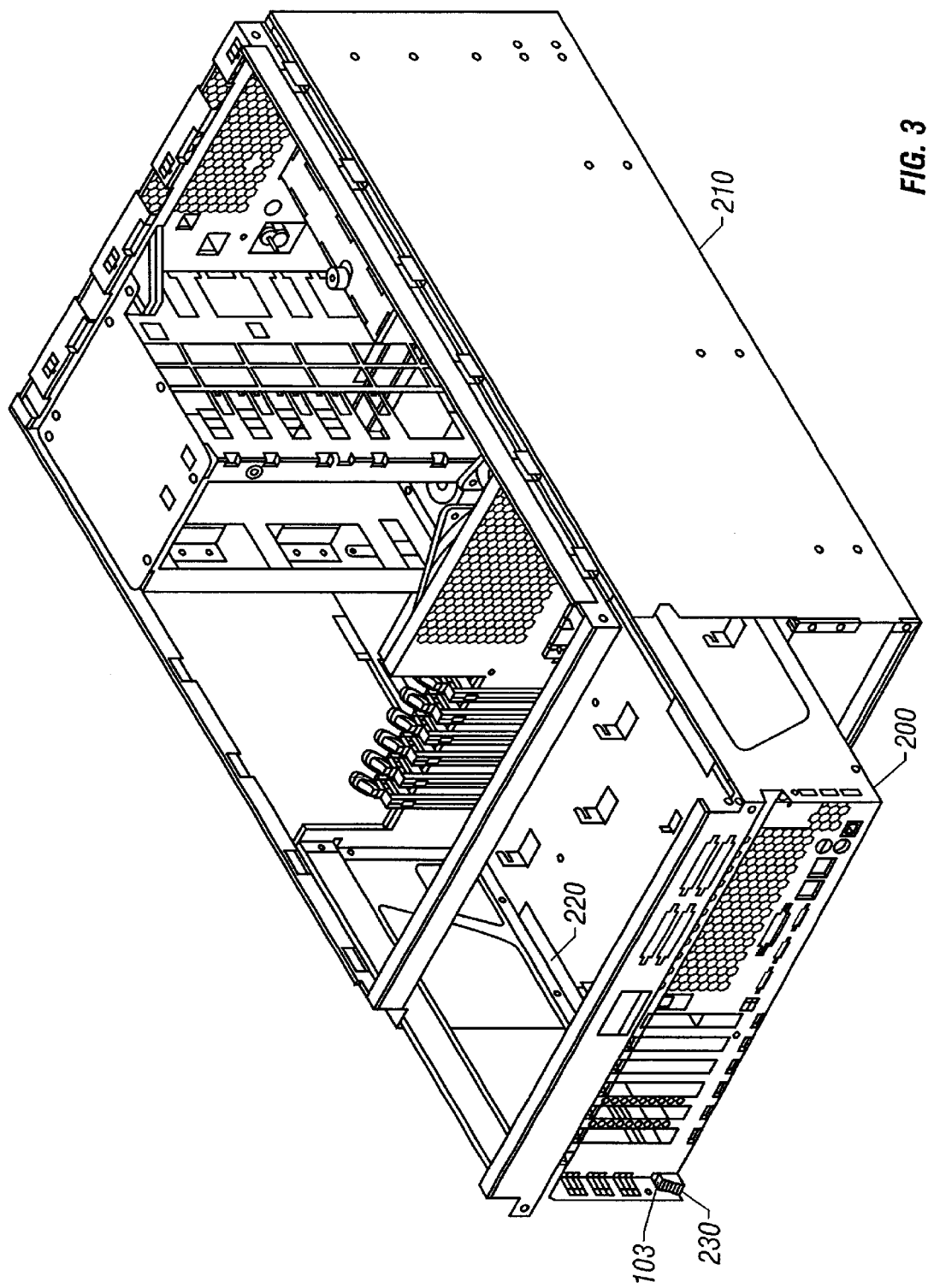
FIG. 3 is an electronics module drawer and computer chassis in service position showing the latch actuator illustrated in FIG. 1.

FIG. 3 shows the electronics module 200 inside the computer chassis 210. FIG. 3 shows the electronics module 200 in a service position so that electronic devices that are made inaccessible by the electronics module 200 may be reached. FIG. 3 shows the latch actuator 230, which is part of the latch 220, secured to the bottom of the electronics module 200. As shown, the latch is secured to the module 200. A force applied to the actuator 230 causes the latch 220 to deflect.

Figure 4:
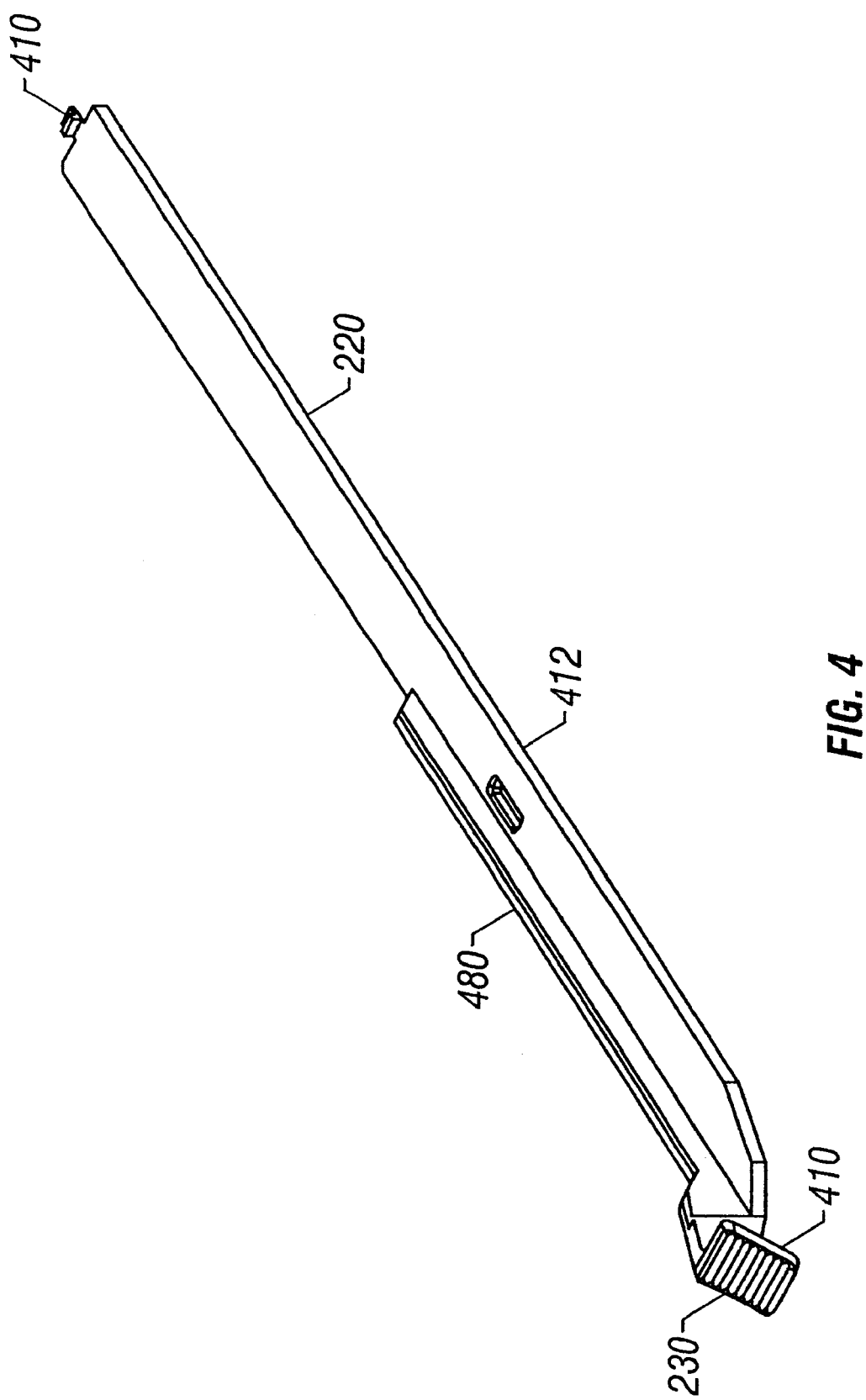
FIG. 4 is a perspective top view of the latch and release apparatus showing a stiffening beam to make the latch bend in the proper place, the actuator, and the tab for assembly to the module.

Referring to FIG. 4, a perspective top view shows an embodiment of the latch 220. The latch 220 includes an elongated planar member 412 having a length, width, and thickness. The latch 220 is typically constructed of a plastic material such as a polycarbonate, ABS, or polyvinylchloride (PVC) resin, or a blend of Polycarbonate and ABS, such as BAYBLEND produced by BAYER Corporation. The length of the latch 220 is substantially greater than the width, typically about twenty times the width. In various embodiments, the latch 220 may have a length that is generally in a range of five times to fifty times the width or more, depending on the material used to construct the latch 220. The width of the latch 220 is also substantially greater than the thickness, typically about ten times the thickness. In various embodiments, the latch 220 may have a width that is generally in a range of three times to thirty times the thickness or more, also depending on the material used to construct the latch 220. The length, width, and thickness of the latch 220 are determined depending on the flexibility, strength, and durability of the material used to construct the latch 220.

The actuator 230 is integrally connected at one end of the elongated planar member 412 of the latch 220 and typically includes a manipulation surface 410 to facilitate application of a force to the latch 220. The actuator 230 is a tab that is connected to the elongated planar member 412 of the latch 220 and extends from the end of the latch 220 toward a medial portion of the elongated planar member 412 to form a reinforcement beam 480. The reinforcement beam 480 extends a length generally in a range from about one-third to two-thirds the total length of the latch 220. Commonly, the reinforcement beam 480 extends about half the total length of the elongated planar member 412 but the extension length varies depending on the material used to construct the latch 220 and a desired position of flexure of the latch 220.

An engagement structure 410 or snap is formed on the end of the elongated planar latch member 220 opposite the actuator 230. The engagement structure 410 is an insert protrusion that is generally molded to the latch 220 for affixing the latch 220 to the electronics module 200. The actuator 230, the reinforcement beam 480, the engagement structure 410, and the elongated planar member 412 are generally molded to form a single integral structure of the latch 220.

Figure 5:
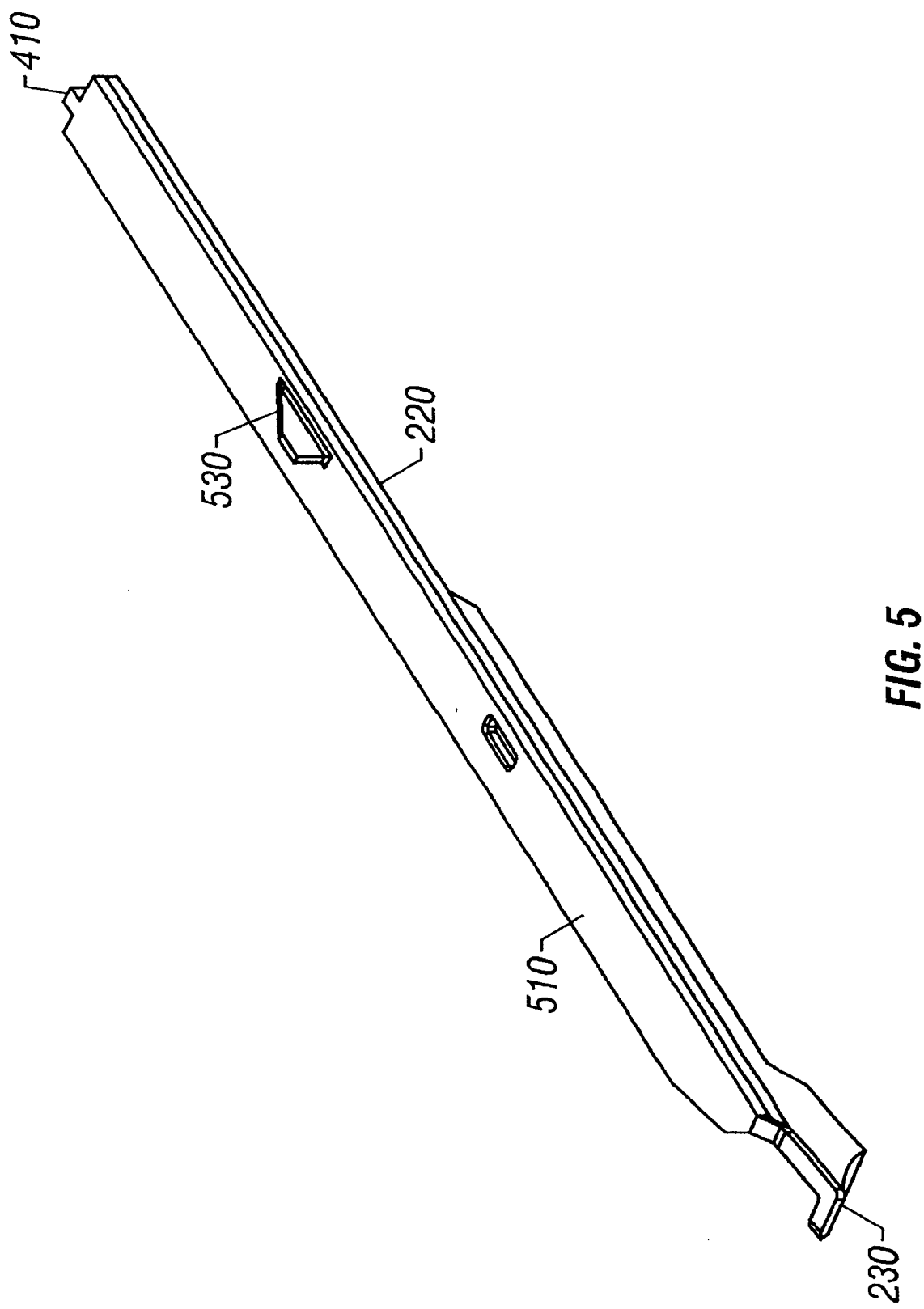
FIG. 5 is a perspective underside view of the latch and release apparatus showing the locking tab.

Referring to FIG. 5, a perspective bottom view shows the latch 220 in an inverted position. A locking tab 530 is molded onto the bottom 510 of the elongated planar member 412 at a position removed from the actuator 230 by a length greater than the length of the reinforcement beam 480. The locking tab 530 is removed from the actuator 230 beyond the reinforcement beam 480 to a position on the elongated planar member 412 that flexes when a force is applied to the actuator 230.

Figure 6:
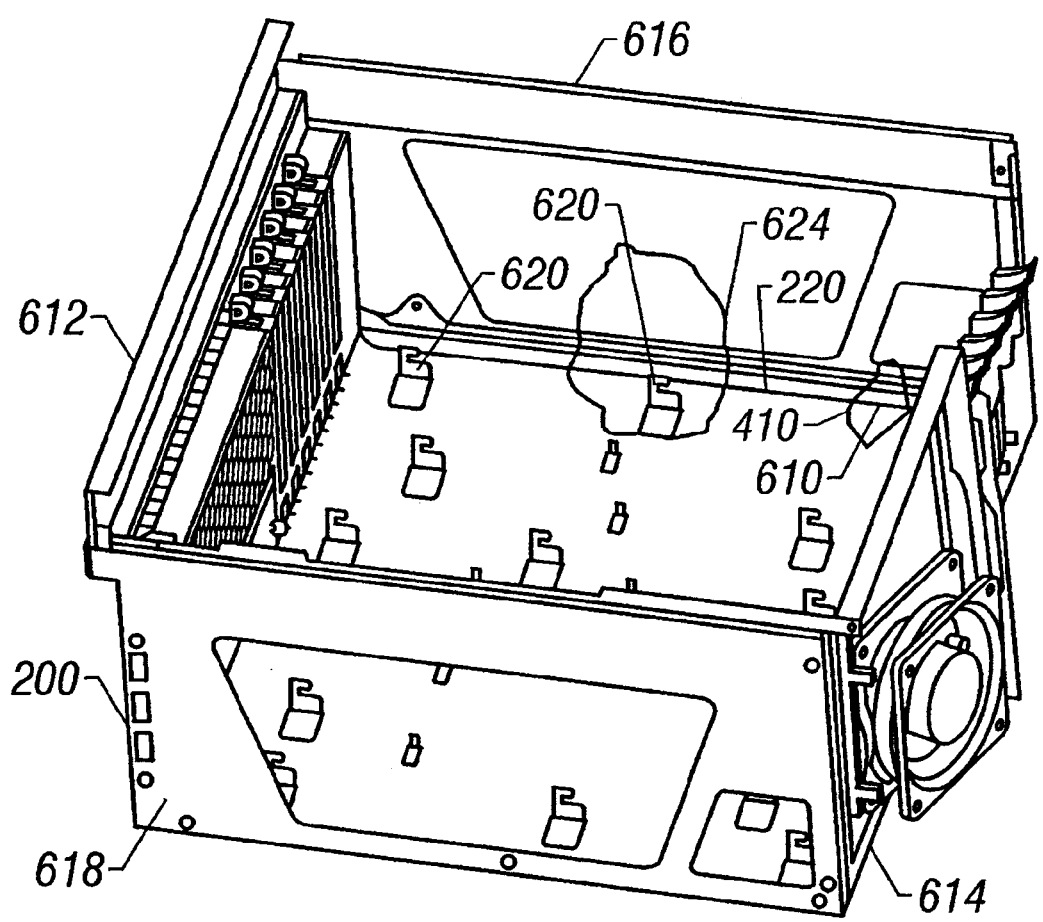
FIG. 6 is a perspective view of the latch and release apparatus inside the electronics module drawer showing how the latch is secured to the planar plate of the electronics module and where the latch bends to lift the locking tab above the bottom of the module.
Figure 7:
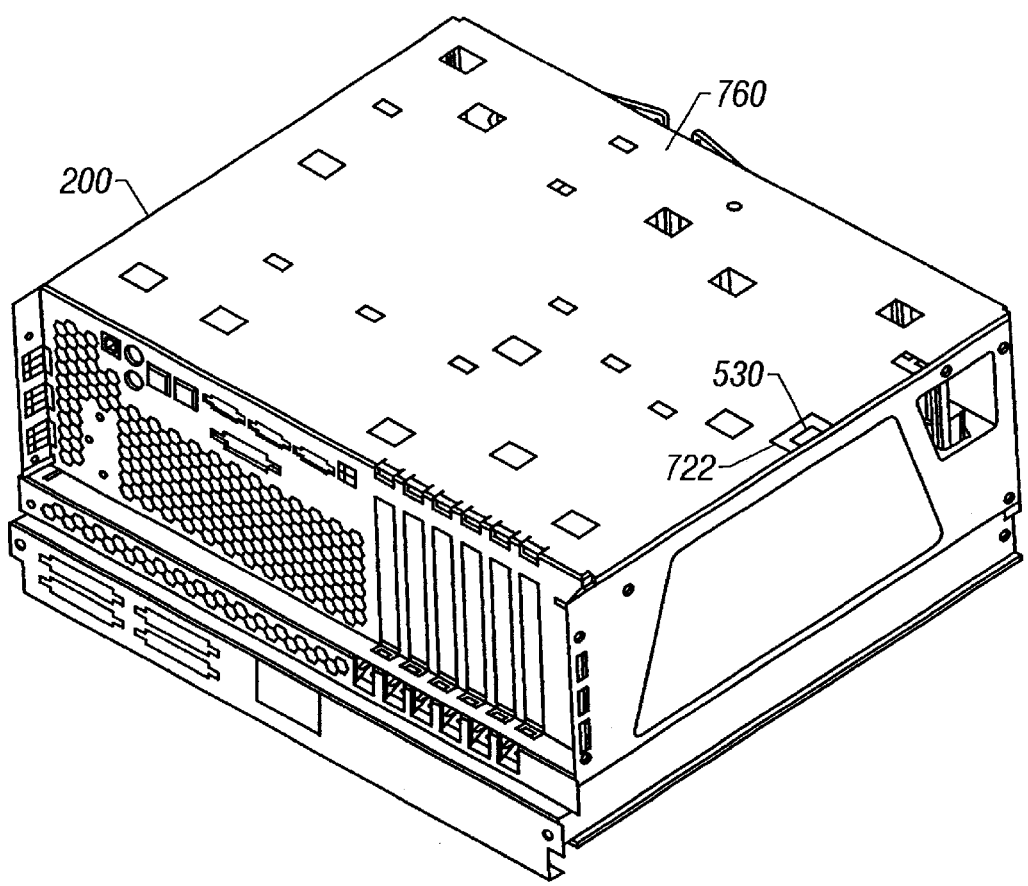
FIG. 7 is an inverted view of the electronics module outside the computer chassis showing a planar plate latch locking tab protruding through a tab hole of the encasement under the electronics module.

Referring to FIGS. 6 and 7, a perspective top view and a perspective bottom view show the electronics module 200 with the engagement structure 410 of the latch 220 affixed, or snapped, into a retainer tab 610. FIG. 6 shows a top view of the electronics module 200 removed from the computer chassis 210. The retainer tab 610 in the illustrative latch 220 is a sheet metal tab having connection structures that are suitable for firmly attaching the engagement structure 410. The illustrative electronics module 200 is formed in the shape of a drawer and includes the planar base plate 240, a front panel 612, a back panel 614, and side panels 616 and 618. An actuator slot (not shown) is formed in the front panel 612 and receives the actuator 230 portion of the latch 220. The planar base plate 240 includes rails 620 that are cut from the planar base plate 240 and bent perpendicular to the plane of the planar base plate 240 to operate as guides for laterally constraining the latch 220 when attached to the electronics module 200.

A locking tab slot 722 is cut into the planar base plate 240 of the electronics module in a position aligned to receive the locking tab 530. Accordingly, the length of the elongated planar member 412 from the actuator 230 to the locking tab 530 coincides with the length from the front panel 612 of the electronics module 200 to the locking tab slot 622. The chassis 210 includes a plurality of slots which receive the locking tab 530 for positioning the electronics module 200 in a plurality of selected positions.

When a force is applied to the actuator 230, the latch 220 bends at a flex region 624, raising the locking tab 530 of the elongated planar member 412 at least partially out of the locking tab slot 722 and completely out of a slot in the chassis 210. When the locking tab 530 is flexed out of the slot in the chassis 210, the electronics module 200 is no longer constrained within the chassis 210 and may be moved.

Referring to FIG. 7, a perspective view shows the electronics module 200 in an inverted position so that the bottom side of the planar base plate 240 is directed upward for viewing. A slot 722 is cut and extends fully through the planar base plate 240. When no force is applied to the actuator 230, the locking tab 530 protrudes through the elongated planar member 412 via the locking tab slot 722 into a slot in the chassis 210, fixing the position of the electronics module 200 within the chassis 210. When a force is applied to the actuator 230, the elongated planar member 412 bends so that the locking tab 530 no longer protrudes outside the electronics module 200. The locking tab 530 is lifted to clear a slot in the chassis 210 so that the electronics module 200 may be repositioned with respect to the chassis 210.

Figure 8:
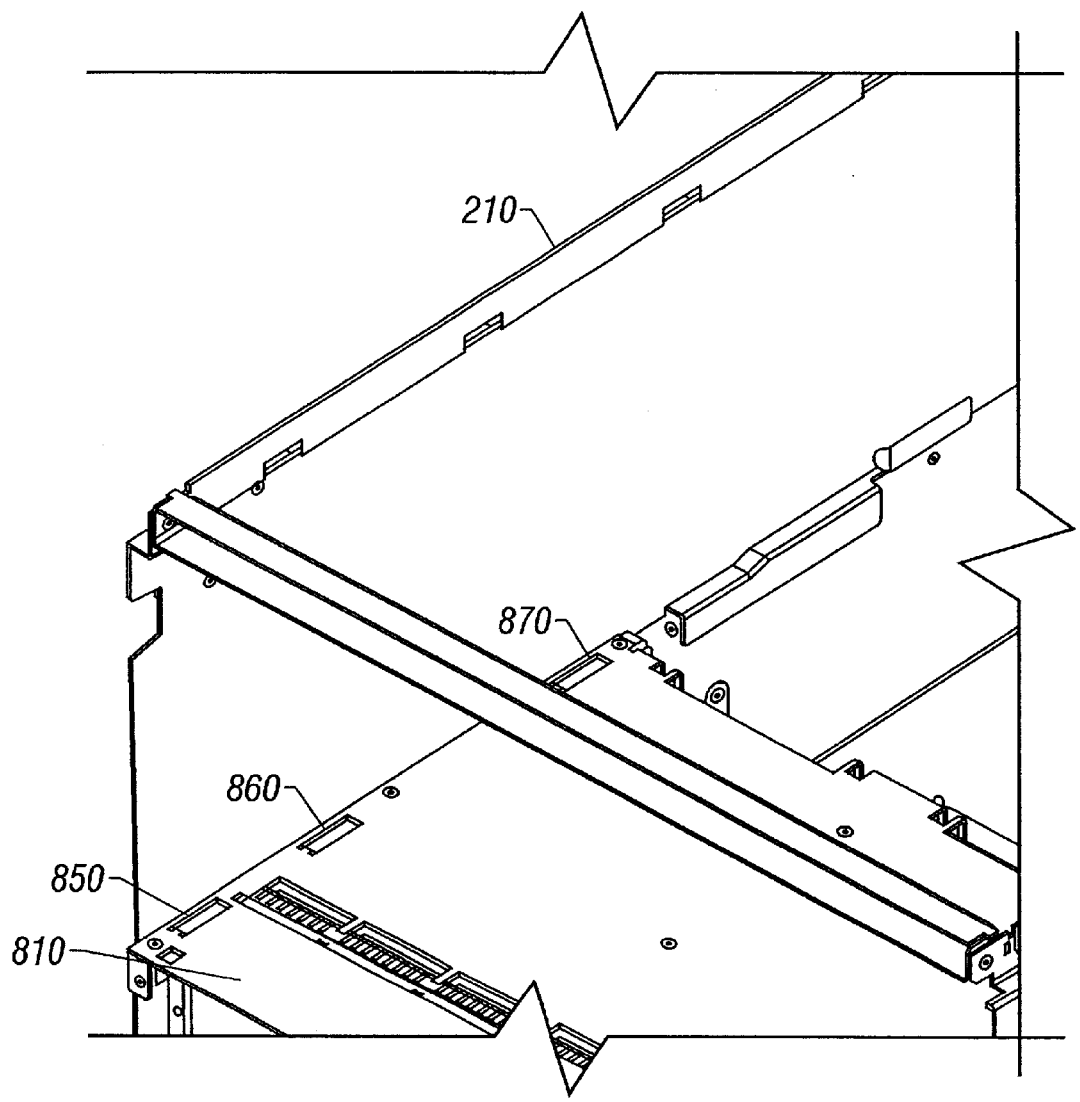
FIG. 8 shows the computer chassis prior to installation of the electronics module drawer and attachment of the latch and release apparatus to show the slots for closed position, service position and removal position.

Referring to FIG. 8, a perspective view shows the chassis 210 including a plurality of slots for receiving the locking tab 530 through the locking tab slot 722 in the electronics module 200. The illustrative chassis 210 has a cabinet shelf floor 810 with three slots including an open position slot 850, a service position slot 860, and a closed position slot 870. The plurality of slots permit the electronics module 200 to be positioned into one of a plurality of locations. The position into which the electronics module 200 is removably locked is determined by the location of the slots in the chassis 210. When the locking tab 530 is inserted into the closed position slot 870, application of a force to the actuator 230 while pulling the electronics module 200 from the chassis 210 allows the electronics module 200 to be moved from a closed position to another position. The electronics module 200 may be moved to the service position or the removal position, in which the latch holds the electronics module 200 in a position as a safe last stopping point before completely removing the electronics module 200 from the chassis 210.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims. Furthermore, throughout the claims the term "a" is used to introduce an element but does not in any instance refer to a single or "one" element but instead refers to "one or more than one" element.

What is claimed is:

1. An apparatus for latching and releasing a drawer in a chassis comprising:
    an elongated bendable member for detachable coupling to the drawer, the bendable member having a first end and a second end and including:
        an engagement structure located at the first end of the bendable member, the engagement structure being firmly engageable to an engagement retainer in the drawer;
        an actuator located at the second end of the bendable member, the actuator being insertable through an actuator slot in the drawer and held by the actuator slot, a force applied to the actuator causing bending of the bendable member; and
    a lock tab located on a bendable surface of the bendable member, the lock tab extending through a tab slot in the drawer and further extending into a slot in the chassis when no force is applied to the actuator, the bendable member bending so that the lock tab clears the tab slot when the force is applied to the actuator tab, the lock tab capable of securing the drawer in a plurality of positions relative to the chassis, the lock tab extending into one of a plurality of slots in the chassis when the drawer is pulled to one of the plurality of positions.

2. An apparatus according to claim 1, wherein:
    the engagement structure is an insert protrusion located at the first end of the bendable member;
    the engagement retainer is a retainer tab at a fixed position in the drawer; and
    the insert protrusion snapping into firm engagement by the retainer tab.

3. An apparatus according to claim 1, wherein:
    the bendable member further includes:
        a beam formed on the bendable surface of the bendable member, the beam being a support for stiffening a portion of the bendable member to position a point of flexure of the bendable member in the vicinity of the lock tab.

4. An apparatus according to claim 1 wherein the drawer is a computer electronics module.

5. An apparatus according to claim 1 wherein:
    the drawer is a metal computer electronics module; and
    the bendable member is a plastic elongated bendable member.

6. The apparatus of claim 1 wherein the plurality of slots in the chassis include a closed position slot, a service position slot, and a removal position slot.

7. The apparatus according to claim 6 wherein the force applied to the actuator flexes the bendable member so that the lock tab is disengaged from a slot of the plurality of slots in the chassis so that the drawer is moveable to a different position.

8. The apparatus according to claim 6 wherein:
    the bendable member is a single-piece, integral elongated member.

9. A method for manipulating an electronics module in a computer chassis of a computer system comprising:
    disengaging an elongated bendable member detachably coupled to the electronics module, the bendable member having a first end and a second end and including:
        an engagement structure located at a first end of the bendable member, the engagement structure being firmly engageable to an engagement retainer in the electronics module;
        an actuator located at the second end of the bendable member, the actuator being insertable through an actuator slot in the electronics module and held by the actuator slot, a force applied to the actuator causing bending of the bendable member; and
    a lock tab located on a bendable surface of the bendable member, the lock tab extending through a tab slot in the electronics module and further extending into a slot in the chassis when no force is applied to the actuator, the bendable member bending so that the lock tab clears the tab slot when the force is applied to the actuator, the lock tab capable of securing the electronics module in a plurality of positions relative to the chassis, the lock tab extending into one of a plurality of slots in the chassis when the electronics module is pulled to one of the plurality of positions;
    disengaging the electronics module from the chassis by applying a force upon an actuator of the electronics module; and
    applying a force in an opposing direction to the electronics module causing the electronics module to move in the chassis.

10. A method according to claim 9 wherein:
    the engagement structure is an insert protrusion located at the first end of the bendable member;
    the engagement retainer is a retainer tab at a fixed position in the drawer; and
    the insert protrusion snapping into firm engagement by the retainer tab.

11. A method according to claim 10 wherein the bendable member further includes:
    a beam formed on the bendable surface of the bendable member, the beam being a support for stiffening a portion of the bendable member to position a point of flexure of the bendable member in the vicinity of the lock tab.

12. A method according to claim 11 wherein the plurality of slots in the chassis includes a closed position slot, a service position slot, and a removal position slot.

13. A method according to claim 12 wherein:
    the force applied to the actuator flexes the bendable member so that the lock tab is disengaged from a slot of the plurality of slots in the chassis so that the drawer is moveable to a different position.

14. A method according to claim 9 wherein the bendable member is a plastic elongated bendable member.

15. A method according to claim 9 further comprising:
    grasping the electronics module after the electronics module is moved in the chassis to the removal position; and
    removing the electronics module from the chassis.

16. A method according to claim 15 further comprising:
    grasping the electronics module after the electronic module has been removed from the chassis; and placing the electronics module into the chassis by applying a force upon the actuator and applying force against the electronics module so that the electronics module is in one of the removal position, the service position and the closed position in the chassis.

17. A computer system comprising a chassis;

an electronics module having a processor coupled to a memory; and a bendable member having a first end and a second end and including:
   an engagement structure located at a first end of the bendable member, the engagement structure being firmly engageable to an engagement retainer in the electronics module;
   an actuator located at the second end of the bendable member, the actuator being insertable through an actuator slot in the electronics module and held by the actuator slot, a force applied to the actuator causing bending of the bendable member; and
a lock tab located on a bendable surface of the bendable member, the lock tab extending through a tab slot in the electronics module and further extending into a slot in the chassis when no force is applied to the actuator, the bendable member bending so that the lock tab clears the tab slot when the force is applied to the actuator, the lock tab capable of securing the electronics module in a plurality of positions relative to the chassis, the lock tab extending into one of a plurality of slots in the chassis when the electronics module is pulled to one of the plurality of positions.

18. The computer system of claim 17 wherein:
the engagement structure is an insert protrusion located at the first end of the bendable member;
the engagement retainer is a retainer tab at a fixed position in the drawer; and
the insert protrusion snapping into firm engagement by the retainer tab.

19. The computer system of claim 17 wherein:
the bendable member further includes:
   a beam formed on the bendable surface of the bendable member, the beam being a support for stiffening a portion of the bendable member to position a point of flexure of the bendable member near the lock tab.

20. The computer system of claim 17 wherein the bendable member is a plastic elongated bendable member.

21. The computer system of claim 17 wherein the plurality of slots in the chassis includes a closed position slot, a service position slot, and a removal position slot.

22. The computer system of claim 21 wherein the force applied to the actuator flexes the bendable member so that the lock tab is disengaged from a slot of the plurality of slots in the chassis so that the drawer is moveable to a different position.

23. The computer system of claim 17 wherein the bendable member is a single-piece, integral elongated member.

24. An article of manufacture as described in claim 1.

* * * * *